United States Patent [19]
Kusase et al.

[11] Patent Number: 5,543,703
[45] Date of Patent: Aug. 6, 1996

[54] GENERATOR MOTOR FOR VEHICLES

[75] Inventors: Shin Kusase; Kenzo Mitani, both of Obu; Atsushi Umeda, Anjo; Norihito Tokura, Okazaki; Hirohide Sato, Toyokawa, all of Japan

[73] Assignee: Nippondenso Co., Ltd., Kariya, Japan

[21] Appl. No.: 362,408

[22] Filed: Dec. 23, 1994

[30] Foreign Application Priority Data

Dec. 24, 1993 [JP] Japan .................................. 5-326597

[51] Int. Cl.⁶ .................................. H02P 6/00; H02P 9/04
[52] U.S. Cl. .............................. 322/16; 322/15; 322/39; 290/22; 180/65.4
[58] Field of Search ................................. 322/10, 14, 15, 322/16; 180/65.4; 290/1 A, 1 R

[56] References Cited

U.S. PATENT DOCUMENTS

| | | | |
|---|---|---|---|
| 4,803,376 | 2/1989 | N'Guyen | 290/22 |
| 5,170,231 | 12/1992 | Fujii et al. | |
| 5,177,677 | 1/1993 | Nakata et al. | |
| 5,469,816 | 11/1995 | Murakawa et al. | 123/2 |

FOREIGN PATENT DOCUMENTS

| | | |
|---|---|---|
| 130242 | 1/1985 | European Pat. Off. |
| 338512 | 10/1989 | European Pat. Off. |
| 522819 | 1/1993 | European Pat. Off. |
| 4007350 | 9/1990 | Germany |
| 63-202255 | 8/1988 | Japan |
| 4138030 | 5/1992 | Japan |
| 2168557 | 1/1986 | United Kingdom |
| 9326047 | 12/1993 | WIPO |

OTHER PUBLICATIONS

Patent Abstracts of Japan, vol. 017 No. 006, (E-1302), Jan. 7, 1993 & JP-A-04 239776, Aug. 27, 1992.
Patent Abstract of Japan, vol. 012 No. 486, (E-695), Dec. 19, 1988 & JP-A-63 202255, Aug. 22, 1988.
Patent Abstract of Japan, vol. 018 No. 088 (E-1507), Feb. 14, 1994 & JP-A-05 292799, Nov. 5 1993.

*Primary Examiner*—Steven L. Stephan
*Assistant Examiner*—Nicholas Ponomarenko
*Attorney, Agent, or Firm*—Cushman Darby & Cushman, L.L.P.

[57] ABSTRACT

A vehicular generator motor performing generator operation and motor operation is disclosed. The generator motor comprises an AC-DC converter means and a switching means. The converter means is composed of a plurality of MOSFETs and connected between each armature coil and a vehicular storage battery. Alternating current produced across the coils is converted into a direct current for charging the battery by the AC-DC converter means in generator operation mode. In motor operation mode, the DC output from the battery is converted into an alternating current for setting up a rotating magnetic field by the converter means, and the battery output is fed to the armature coils. The mode of operation of the MOSFETs is switched between these two modes by the switching means. The rotating field produces a certain phase difference with the magnetic field developed by the rotating magnetic poles. The MOSFETs are made of SiC having a smaller resistivity than that of Si. This ensures a high withstand voltage necessary during power generation. Loss caused by large current flowing in the motor operation mode is reduced. Good driving torque can be obtained.

10 Claims, 12 Drawing Sheets

GENERATOR MOTOR FOR VEHICLES

CROSS REFERENCE TO RELATED APPLICATION

This application is based upon and claims the benefit of priority of Japanese Patent Application No. 5-326597 filed on Dec. 24, 1993, the contents of which are incorporated herein by reference.

BACKGROUND OF THE INVENTION

1. Field of the Invention

The present invention relates to a vehicular generator motor which acts to generate electric power by receiving torque from an engine and to perform motor operation for imparting torque to the engine.

2. Related Art

One kind of generator motor is described in Japanese Patent Laid-Open No. 202255/1988 and uses MOSFETs as switching devices for controlling the electrical currents flowing through armature coils. Zener diodes are employed to compensate for the voltage-withstanding characteristics of the MOSFETs.

The inventor of this known technique noticed the fact that trade-offs were made between the ON resistance of each MOS transistor fabricated on a silicon substrate and the required withstand voltage of the device. The withstand voltage of the MOS transistor is set lower by adding a power Zener diode. According to this prior art, the resistance during the transistor turns on can be made low value by thinning a voltage-withstanding layer of the device. Thus, it can be considered that the starting characteristics are improved to some extent. However, this known technique suffers from the following problems. When generator action is performed, the added power Zener diodes act as commutating diodes which must handle large electric currents at all times. If the Zener diodes vary among commercial products, energy is concentrated in such a device which has a lower Zener voltage when surges are being absorbed. As a result, the device is easily destroyed. This makes it necessary to set the surge voltage resistance at a high value. Alternatively, it is necessary to check the Zener voltage characteristics of the Zener diodes. Then, they must undergo a sorting step. These greatly increase the cost. Furthermore, separate heat-dissipating fins are required for the Zener diodes. This increases the size of whole apparatus.

More specifically, in the generator motor fabricated in the prior art technique as described above, a high voltage is generated inside the generator motor during generator operation. For example, in the case of a 12 V storage battery, the generated voltage is more than 10 times as high as the battery voltage, i.e., 150 to 300 V. The devices are required to be protected against such a high voltage. This urges the ON resistance of the devices to be set higher than the ON resistance used where the machine performs only motor operation. In the latter case, the devices are required to withstand a voltage that is only several times as high as the power voltage. Especially, when an engine at rest is started, the large starting current is controlled with these high ON resistive devices each having a thick voltage-withstanding layer. This further increases the ON resistance and produces the disadvantage that a considerable portion of the applied battery voltage is lost by the MOSFETs as a voltage drop.

SUMMARY OF THE INVENTION

The present invention is intended to solve the foregoing difficulties by using devices which are essentially different from the prior art silicon MOS transistors, much superior in voltage resistance to the prior art MOS transistors, and have lower ON resistances than the prior art MOS transistors.

The present invention provides a generator motor for vehicles, the generator motor comprising: rotating magnetic poles rotating with a rotating shaft which is driven by a crankshaft of an engine; an armature having armature core mounted to a housing and armature coils wound on the core; an AC-DC converter means composed of plural MISFETs and connected between the armature coils and a battery; and a switching means for switching the mode of operation of the MISFETs between a generator operation mode and a motor operation mode. Each of the MISFETs are made of silicon carbide (SIC). In the generator operation mode, AC outputs from the armature coils are converted into DC outputs for charging the battery. In the motor operation mode, electrical current is supplied from the battery to the armature coils so that the coils produce a rotating magnetic field. This rotating magnetic field produces a certain phase difference with a magnetic field generated by the rotating magnetic poles.

In the above-described construction, the MISFETs of the AD-DC converter means, which are required to high withstand voltages when electric power is generated and to exhibit low ON resistances for large currents flowing when the generator motor acts as a motor, are made of SiC material. In consequence, the voltage drop, which is lost by the devices, is reduced greatly. Almost the whole battery voltage can be supplied to the armature windings. As a result, good driving torque can be obtained.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

The preferred embodiments of the present invention are hereinafter described with reference to the accompanying drawings.

Figure 1:
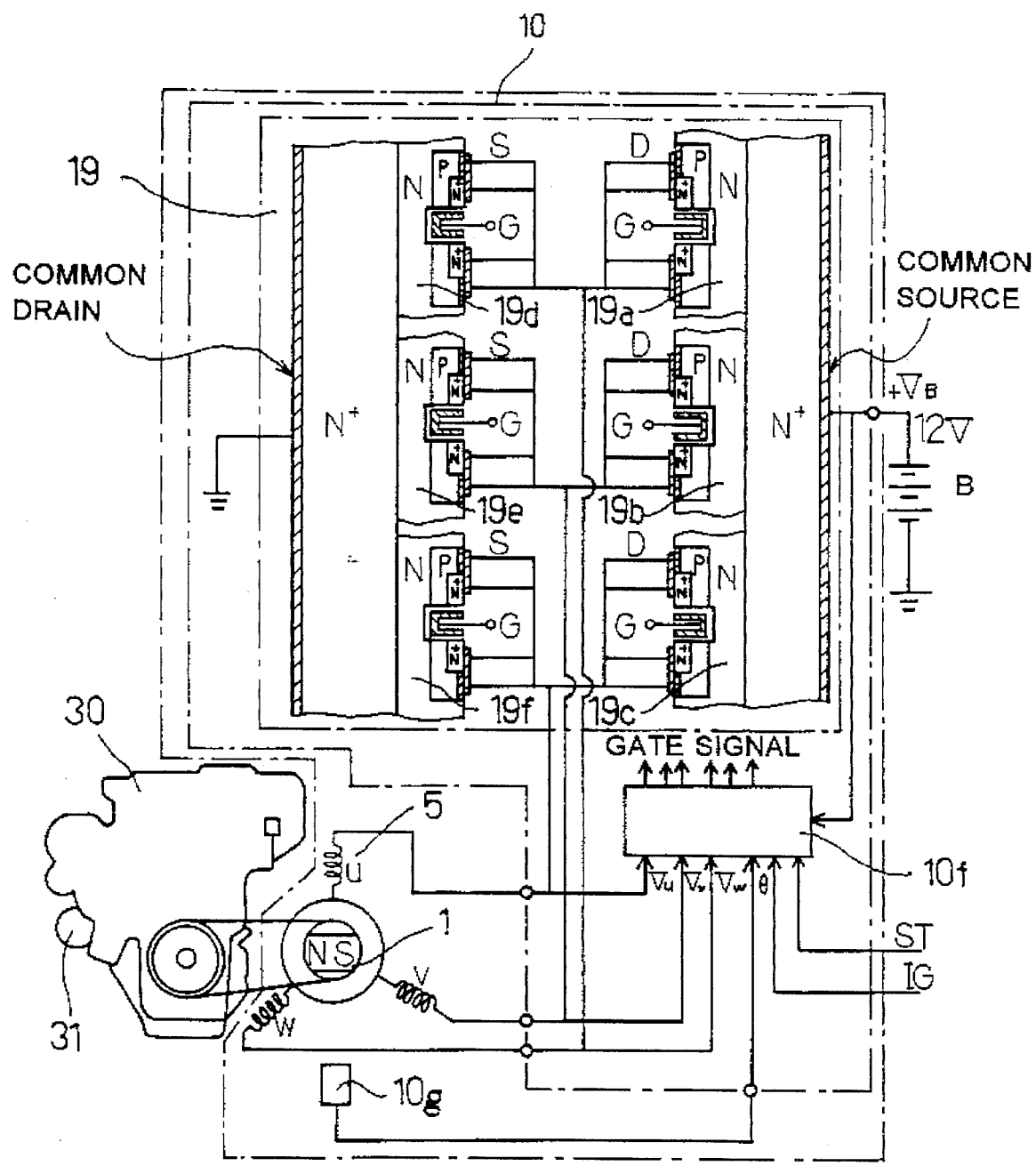
FIG. 1 is a circuit diagram of a first embodiment of the present invention.

FIG. 1 shows the structure of a first embodiment of the present invention. A generator, which can be used as a motor, is composed of a magnet-type rotor 1 and three-phase armature windings 5 across which electric power is induced by the rotor 1 having no excitation-adjusting means. This generator is driven by a vehicular engine 30 via a belt at a speed increase ratio of about 3, the engine being started by a starter (not shown) mainly.

The structure of the generator motor is shown in FIGS. 2 to 5. As shown in these figures, the enclosure of the generator motor comprises a front housing 14 and a rear housing 15 which are integrally fabricated out of an electrically conductive metal. These two housings are coupled together by four bolts 23 extending through the housings. A stator core 2 is rigidly mounted to the inner surfaces of the housings 14 and 15. The three-phase armature windings 5 are wrapped around the stator core 2.

The rotor 1 is rotatably held by bearings 21 and 22 which are firmly secured to the housings 14 and 15, respectively. The rotor 1 has numerous field poles, e.g., 16 poles, and comprises magnets 18, a rotor core 12, a nonmagnetic member 20, and a shaft 16. The magnets 18 and the rotor core 12 are held by the nonmagnetic member 20 and also by the shaft 16.

An integrated commutator (rectifier) 10 is firmly mounted to the inner surface of the rear housing 15 by screws. The integrated commutator 10 has input terminals 10b for entering three-phase AC output currents, a DC output terminal 10c, and a battery signal input terminal 10d. These terminals are located close to the terminals of the three-phase armature windings and extend over short distances to locations opposite to the output terminals of the armature windings. The three-phase armature windings 5 are connected with the three-phase AC current input terminals 10b by soft soldering at the positions of a cooling air delivery windows 26 (described later). The DC current output terminal 10c is connected via a nut with a harness (not shown) for making communication with the positive pole terminal of the vehicular storage battery (not shown). The battery signal input terminal 10d, an engine key switching signal (IG) terminal 10a, an angular position signal input terminal 10e, and an engine starting signal (ST) input terminal 10s are connected by a connector. A signal indicating the angular position of the positive pole of the field winding is supplied to the angular position signal input terminal 10e. The integrated commutator 10 fabricated integrally in this way is surrounded except for the input terminals by a metallic electromagnetic shield member 9 to provide electromagnetic shielding and heat dissipation.

Figure 2:
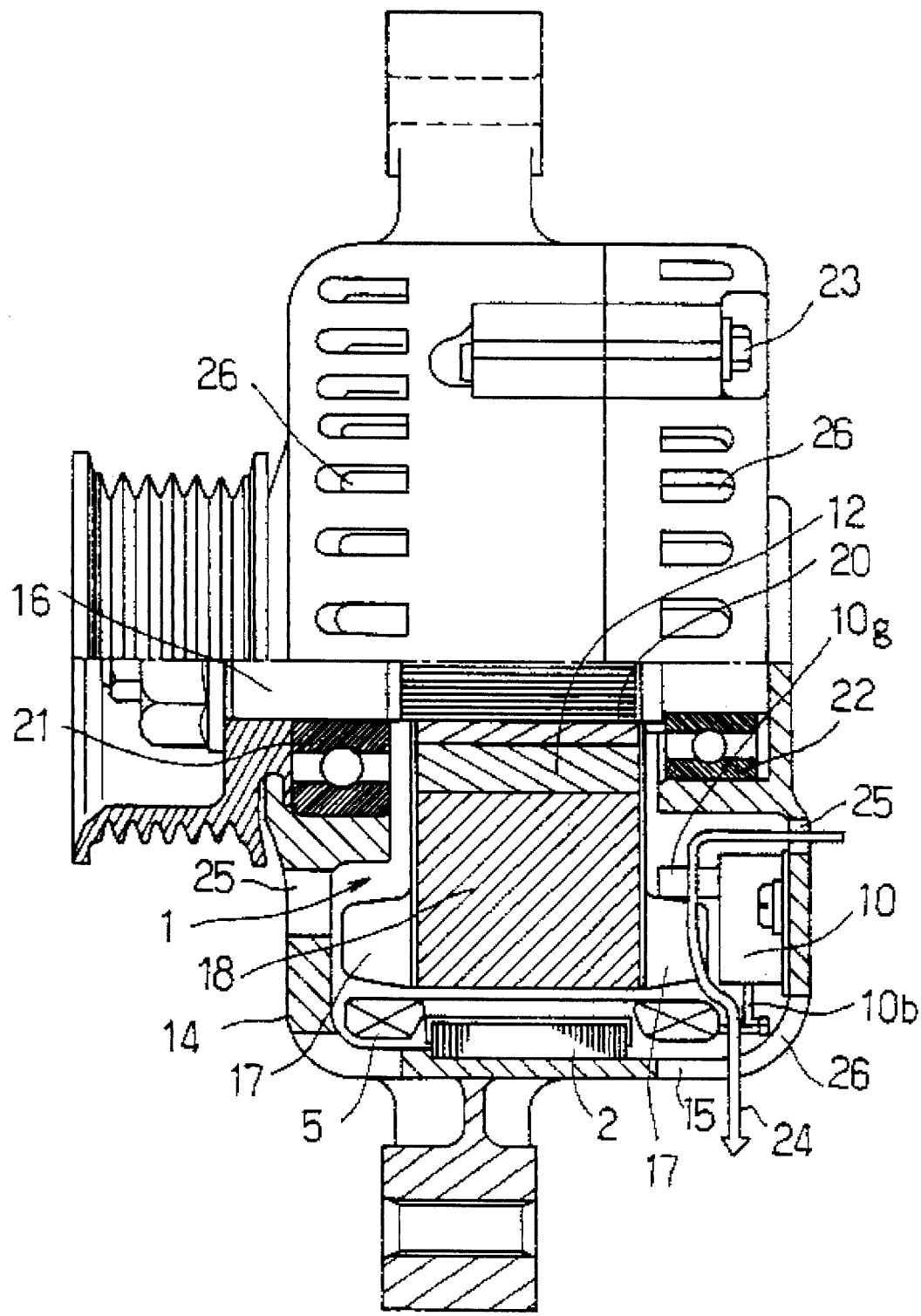
FIG. 2 is a cross-sectional view of a vehicular generator motor according to the first example.
Figure 3:
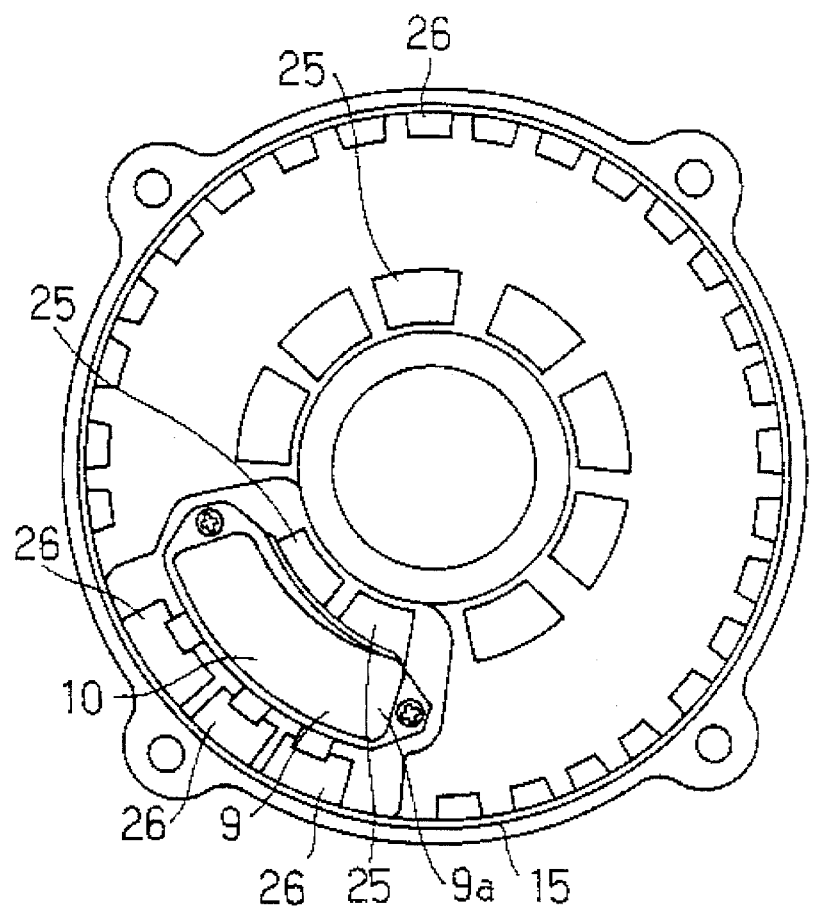
FIG. 3 is a side elevation of the generator motor shown in FIG. 2, as viewed from the rear side, and in which the cover has been removed.
Figure 4:
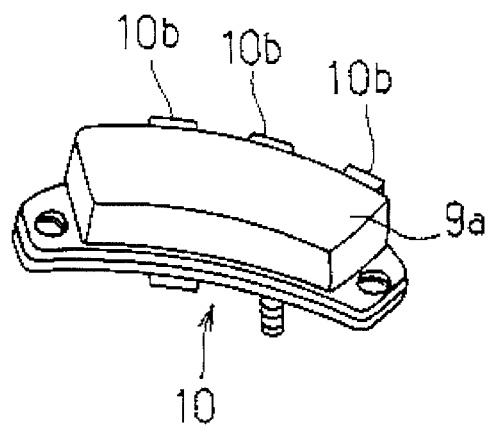
FIG. 4 is a perspective view of a commutator (rectifier) incorporated in the generator motor shown in FIGS. 2 and 3.
Figure 5:
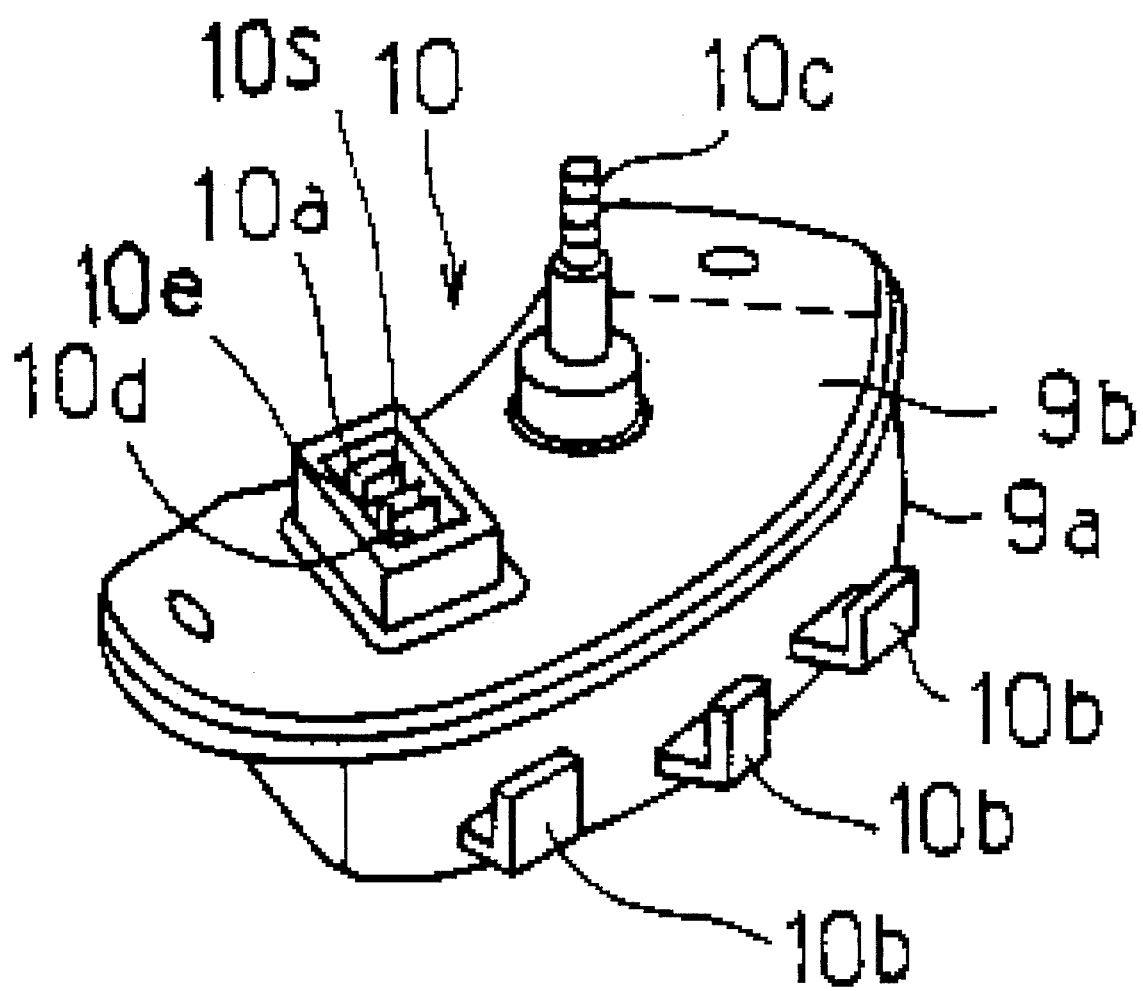
FIG. 5 is a perspective view of the commutator (rectifier) incorporated in the generator motor shown in FIGS. 2 and 3.

The integrated commutator 10 comprises a three-phase full-wave rectification semiconductor circuit 19 and an armature current-switching control circuit 10f for controlling the rectification semiconductor circuit 19. The commutator 10 receives the output signal from a field winding positive pole angular position detector portion 10g which is close to the magnets 18 of the field rotor as shown in FIG. 2 and protrudes beyond a ceiling plate member 9a of the integrated commutator 10. A magnetic sensor (not shown) is mounted to this protruding portion of the detector portion 10g.

Fans 17 are mounted to both side end surfaces of the rotor 1 and inhale cooling air 24 through inhalation windows 25 formed in the front housing 14 and in the rear housing 15. The integrated commutator 10, the inhalation windows 25, and the aforementioned delivery windows 26 are arranged substantially in the centrifugal direction. Thus, a part of the cooling air is blasted against the surface of the ceiling plate member 9a of the electromagnetic shield member 9 which is opposite to the fans 17 and forms a shroud for the fans 17. Then, the air is discharged out of the delivery windows 26. Similarly, a bottom member 9b of the shield member 9 is mounted in an intimate relation to the rear housing 15 so that heat is transferred well.

The percentage of the area occupied by the end surface of the axial rear housing 15 of the integrated commutator 10 constructed as described above is approximately halved compared with that of the three-phase full-wave rectifier of the prior art vehicular AC generator having a voltage regulator and a three-phase full-wave rectifier. This space saving increases the area of the inhalation windows 25 in the rear housing 15 and thus lowers the resistance that the cooling air undergoes. As a result, the temperature of the armature windings 5 is prevented from rising, as well as the temperature of the integrated commutator 10, or their temperatures may be lowered. Hence, the resistance increases in the lead wires and conductors can be suppressed. Consequently, the torque loss of the induction machine can be reduced.

The circuit configuration is next described in detail by referring to FIG. 1.

The three-phase full-wave rectification semiconductor circuit 19 comprises N-channel enhancement-mode metal-oxide semiconductor power FET (MOSFET; corresponding to MISFET of the present invention) devices 19a–19f made of SiC. Each of these semiconductor devices is made of a single crystal of SiC. The crystal structure of the SiC assumes a hexagonal system. The transistors 19a–19c on the higher-voltage side have common source region and common source electrode and are connected between the output terminal of each phase of the three-phase armature windings 5 and the higher-voltage terminal of the battery 21. The transistors 19d–19f on the lower-voltage side have common drain region and common drain electrode and are connected between the output terminal of each phase of the three-phase armature windings 5 and the lower-voltage terminal of the battery 21.

The armature current-switching control circuit 10f receives generated voltages of different phases Vu, Vv, and Vw from the output terminals of the various phases of the three-phase armature windings 5, and controls gate voltages applied to the gate electrodes of the power MOS transistors 19a–19f according to these input signals, respectively. In particular, the armature current-switching control circuit 10f of the integrated commutator 10 reads the voltage developed across the battery 21 and turns on and off the power MOS transistors 19a–19f so that the read voltage is maintained constant. This switching operation is performed in synchronism with the output signal θ from the field winding positive pole angular position detector portion 10g in such a way that a rotating magnetic field created by the armature current rotates at a certain angle with respect to the positive field pole of the rotor.

The armature current-switching control circuit 10f also receives the key switch signal (or, ignition signal) IG and the engine starting signal ST. When the engine is started, the control circuit 10f controls the timing at which the armature current is switched, in such a way that the position of the rotating magnetic field created by the armature current is perpendicular to the field positive pole. In this way, the generator motor performs motor operation.

Figure 6:
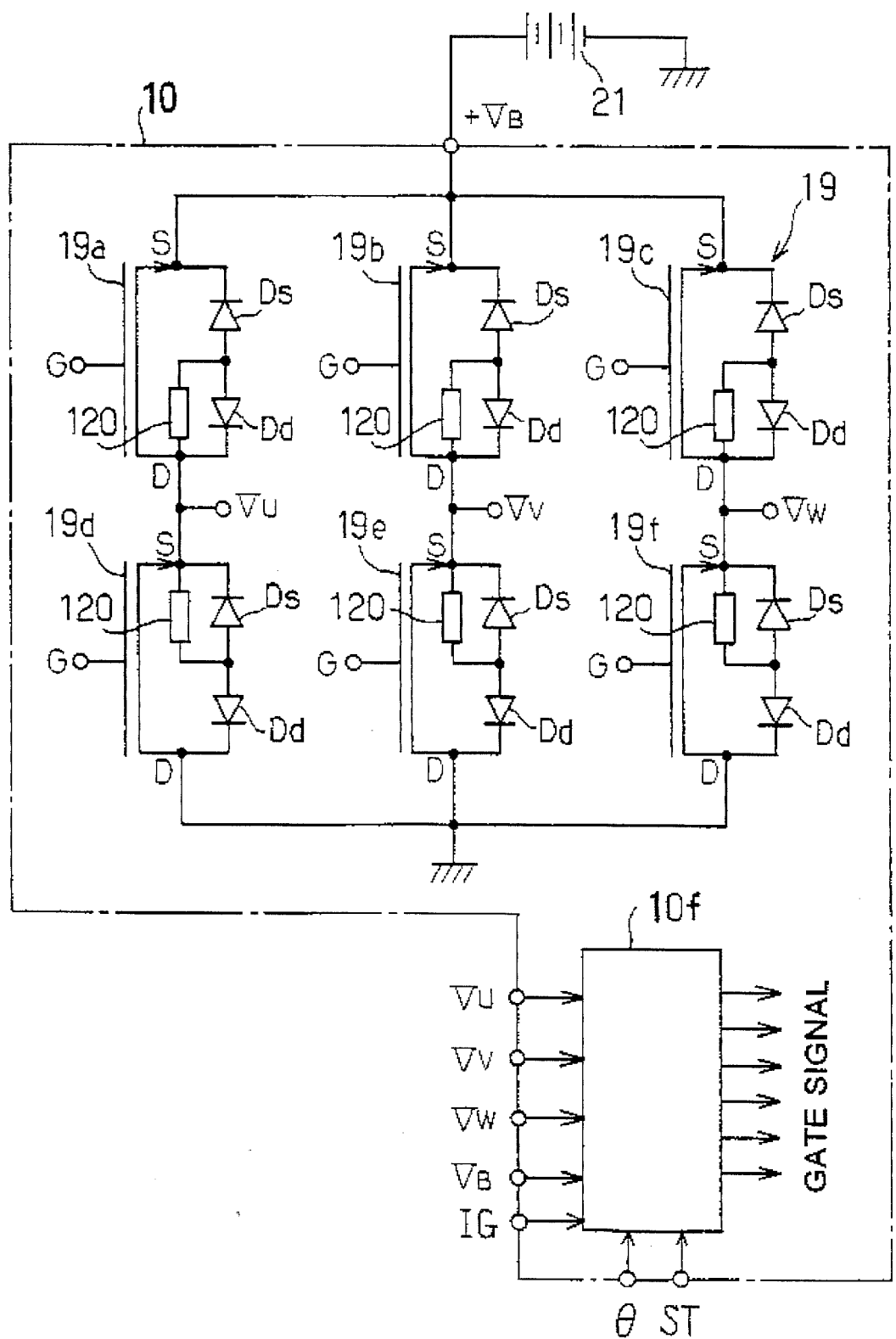
FIG. 6 is a circuit diagram of the vehicular generator motor shown in FIGS. 2 and 3.
Figure 7:
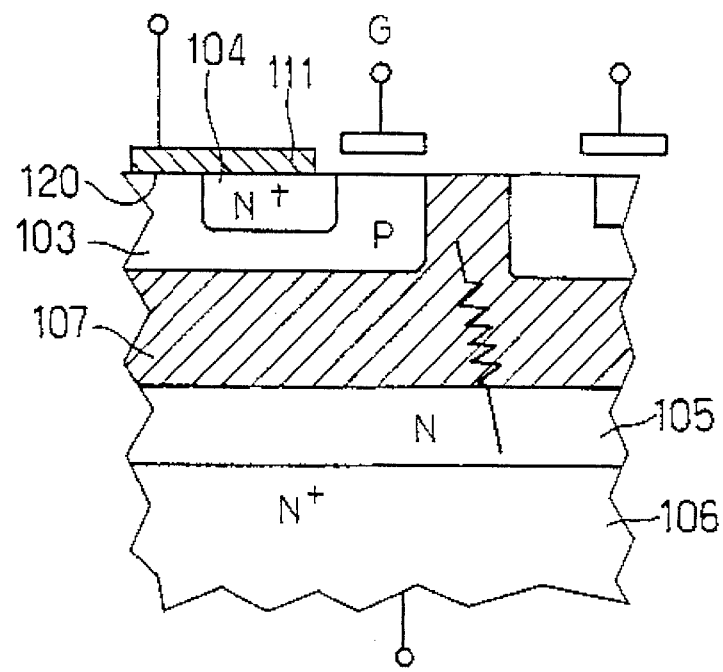
FIG. 7 is a fragmentary enlarged cross-sectional view of a power MOS transistor forming the commutator (rectifier) shown in FIG. 4.
Figure 8:
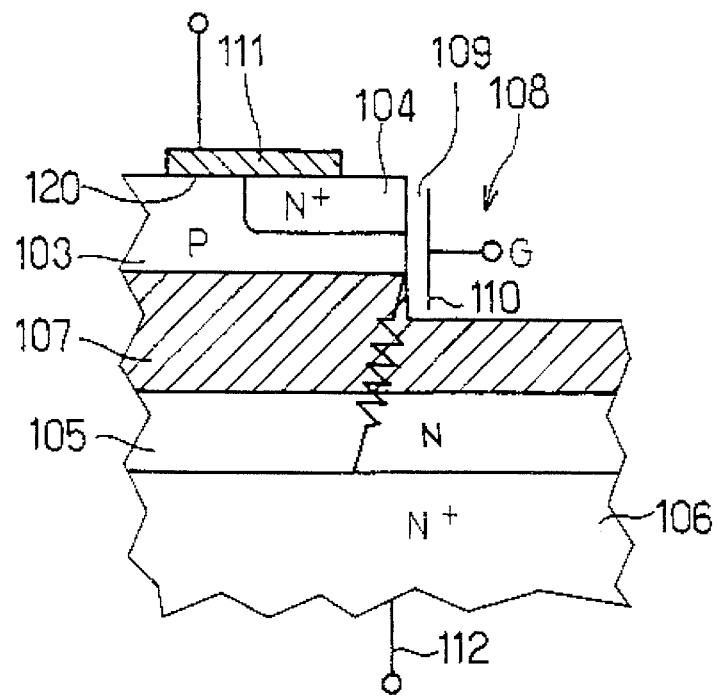
FIG. 8 is a fragmentary enlarged cross-sectional view of another power MOS transistor forming the commutator (rectifier) shown in FIG. 4.

The three-phase full-wave rectification semiconductor circuit 19 comprising the power MOSFETs essentially made of SiC as described above are particularly shown in FIGS. 6, 7, and 8. FIG. 6 is an impedance diagram expressing the three-phase full-wave rectification semiconductor circuit in terms of an electric circuit. FIGS. 7 and 8 show examples of the cross sectional views of the power MOS transistors 19a–19f.

As shown in FIG. 6, in the inverter circuit formed by the N-channel power MOS transistors, the drain electrodes D of the power MOS transistors 19a, 19b, 19c on the higher-voltage side and the source electrodes S of the power MOS transistors 19d, 19e, 19f of the lower-voltage side are connected with the output terminals of corresponding one phase of the three-phase armature windings 5, respectively. The drain electrodes D of the power MOS transistors 19d, 19e, 19f on the lower-voltage sides are connected with the lower-voltage terminal of the battery 21. The source electrode S of the power MOS transistor 10a, 10b, 10c on the higher-voltage side is connected with the higher-voltage terminal of the battery 21. It is to be noted that the direction of charging current is opposite to the direction of movement of electrons during charging of the battery. The source electrodes inject carrier charges into the channels during this charging.

As is well known in the art, parasitic diodes Ds are connected in parallel with the P-well regions and the N-type source regions of the power MOSFETs 19a–19c, 19d–19f. Also, parasitic diodes Dd are connected in parallel with the P-well regions and the N-type drain regions of the power MOSFETs 19a–19c, 19d–19f. The parasitic diodes Ds and Dd are located on the sides of the source and drain electrodes, respectively. However, since it is necessary to apply a potential to the P-type well regions 103, the P-type well regions 103 of the power MOSFETs 19a, 19b, and 19c on the higher-voltage side are connected with drain electrodes 111 via their respective high resistors 120, as shown in FIG. 6, it being noted that the device structure is shown in FIGS. 7 and 8.

On the other hand, the P-type well regions 103 of the power MOSFETs on the lower-voltage side and the source electrodes 111 are short-circuited because it is necessary to impress a potential on the P-type well regions 103. The parasitic diodes Ds of the power MOS transistors 19a, 19b, 19c on the higher-voltage side which are located on the sides of the source electrodes prevent back flow from the battery 21.

Each high resistor 120 has a high resistance value, for example 150 ohms or more. When the power MOSFETs 19d–19f on the lower-voltage side are OFF, if a generated voltage, or a positive potential, is applied to their source electrodes, the high resistors 120 compress electrical currents flowing in the reverse direction via the parasitic diodes Dd on the sides of the drain electrodes in such a manner that the amplitudes of these back currents lie within a tolerable range.

The cross-sectional structure of the power MOSFETs 19a–19c on the higher-voltage sides of the three-phase full-wave rectifier 19 shown in FIG. 6 is now described by referring to FIG. 8. An N-type voltage-withstanding layer 105 is epitaxially grown on an $N^+$-type substrate 106 made of SiC. Aluminum ions are implanted into the surface of the N-type voltage-withstanding layer 105 to form P-type well regions 103. Nitrogen ions are implanted into the surfaces of the P-type well regions 103 to form $N^+$-type regions 104. Openings are formed in only those regions of the wafer surface which will become trench gates. A well-known reactive ion etching process is carried out while masking the openings with a resist or insulating film. In this way, trenches 108 (only one is shown) are formed. A gate-insulating film 109 of silicon oxide is formed on the surfaces of the trenches 108 by thermal oxidation. Gate electrodes 110 of polysilicon are formed in the trenches 108. The gate electrodes 110 are made conductive by doping them with an impurity.

A field insulating film (not shown) is formed on the wafer surface to separate the transistors 19a, 19b, and 19c. Nickel electrodes 111 acting as drain electrodes are in contact with the $N^+$-type regions 104 and the P-type well regions 103 in the transistors 19a, 19b, and 19c. A gold electrode 112 formed as a common source electrode on the rear surface of the substrate is in contact with the $N^+$-type substrate 106. In this way, the device shown in FIG. 8 is built. The nickel electrodes 111 are formed by sputtering or vacuum evaporation.

In this structure, nickel-SiC alloy layers (not shown) of high resistance are formed between the nickel electrodes 111 and the P-type well regions 103. These alloy layers form the high resistors 120 described above. These high resistors 120 can be fabricated easily, and it is not necessary to extend the fabrication process.

In the transistors 19a–19c on the higher-voltage side, each high resistor 120 is connected in parallel with the corresponding parasitic diode Dd between the drain region 104 and the well region 103, the parasitic diode Dd being located on the side of the drain electrode. A potential is applied to the well region 103 through the high resistor 120. Thus, the battery-charging current flowing through the parasitic diode Ds between the source region 105 and the well region 103 on the side of the source electrode is reduced greatly by the high resistor 120. As a result, the battery is well prevented from being overcharged.

On the other hand, in the transistors 19d–19f on the lower-voltage side, each high resistor 120 is connected with the corresponding source electrode. The source potential is impressed on the well region 103 via the high resistor 120. If the potential from the three-phase armature windings 5 is high, and if the drain potential on the power MOSFETs 19d–19f is low, then the parasitic diodes Dd are biased in the forward direction. However, electrical current flowing in the reverse direction through the parasitic diodes Dd is well blocked by the high resistor 120. Therefore, in these power MOSFETs incorporating the high resistors, it is not necessary to short-circuit the well regions to the drain regions in order to apply a potential to the well regions. As a result, voltage-withstanding layers can be formed between their respective well regions and drain regions. This means that power loss and heat generation caused by the source parasitic resistors Rs can be reduced greatly because it is not necessary to form any voltage-withstanding layer between the source electrode and the front end of the channel.

In the present example, if the power MOSFETs are not conducting, if a high voltage, e.g., +300 V, is applied between the source electrode 112 and the drain electrode 111 of each transistor, a depletion layer 107 is extended mainly into the N-type voltage-withstanding layer 105. In consequence, the device is capable of standing up to the high voltage. As a result, the N-type voltage-withstanding layer 105 forms each source feedback resistor Rs. As described previously, power loss is induced by the resistance of the source feedback resistor Rs itself and the channel resistance increasing effect.

However, in the present embodiment, each transistor is made of a single crystal of SiC. Therefore, if the same withstanding voltage as the withstanding voltage of the prior art device of Si is expected, the thickness of the N-type voltage-withstanding layer 105 can be reduced. Alternatively, the ON resistance can be greatly reduced by increasing the dopant concentration.

Where the withstand voltage of the N-type voltage-withstanding layer 105 is 300 V, the conditions under which the N-type voltage-withstanding layer 105 is designed are now discussed.

Where a transistor is made of Si, the breakdown electric field intensity is about 30 V/μm. If the required withstand voltage is 300 V, the thickness of the N-type voltage-withstanding layer is approximately 20 μm. The dopant concentration is about $1 \times 10^{15}$ atoms/cm$^3$. At this time, the resistivity of the N-type voltage-withstanding layer is about 5 Ω·cm.

Where a transistor is made of SiC, the breakdown electric field intensity is approximately 400 V/μm. The thickness of the N-type voltage-withstanding layer 105 is approximately 4 μm. The dopant concentration is about $2 \times 10^{16}$ atoms/cm$^3$. At this time, the resistivity of the N-type voltage-withstanding layer 105 is about 1.25 Ω·cm.

Since the resistance of the N-type voltage-withstanding layer 105 is the product of the resistivity and the thickness, the resistance of the N-type voltage-withstanding layer 105 of SiC can be reduced to about one twentieth of the resistance value of the N-type voltage-withstanding layer 105 of Si.

Eventually, the source parasitic resistance Rs of each power MOSFET of SiC can be reduced to about one fifteenth of that of a power MOSFET of Si. The channel resistance can be reduced accordingly. By combining these advantages, a quite low loss, three-phase full-wave rectification semiconductor circuit 19 acting as a starter for a vehicle and also as a generator can be realized.

That is, we have discovered that the use of SiC improves the breakdown electric field intensity of the N-type voltage-withstanding layer 105 and that the three-phase full-wave rectification semiconductor circuit 19 has an excellent efficiency that cannot be forecasted from the prior art techniques. Of course, the foregoing relation is applied similarly to a situation in which a high voltage other than the above-described 300 V is applied to the N-type voltage-withstanding layer 105.

The three-phase full-wave rectification semiconductor circuit 19 of the present example constructed as described above yields other advantages in the manner described now.

In this magnet-type generator, the generated voltage increases at high rotational speeds. Therefore, in the conventional three-phase full-wave rectifier comprising power MOSFETs, the battery is overcharged even if the MOSFETs are in cutoff state, because the parasitic diodes Dd must be short-circuited and a potential must be impressed on the well region to prevent back flow into the three-phase armature windings from the battery. To solve this problem, in the present example, the drain electrodes D of the power MOSFETs 19a–19c on the higher-voltage side of the three-phase full-wave rectification semiconductor circuit 19 are connected with the P-type well regions 103 by their respective high resistors 120. A potential is applied to the P-type well regions 103 through these high resistors 120.

In this configuration, the parasitic diodes Dd of the power MOSFETs 19a–19c on the higher-voltage side act to block battery-charging current which bypasses the channels and so the battery 21 is prevented from becoming overcharged. The high resistors 120 connected with the transistors on the lower-voltage side limit the short-circuit current through the three-phase armature windings within a tolerable range.

Figure 9:
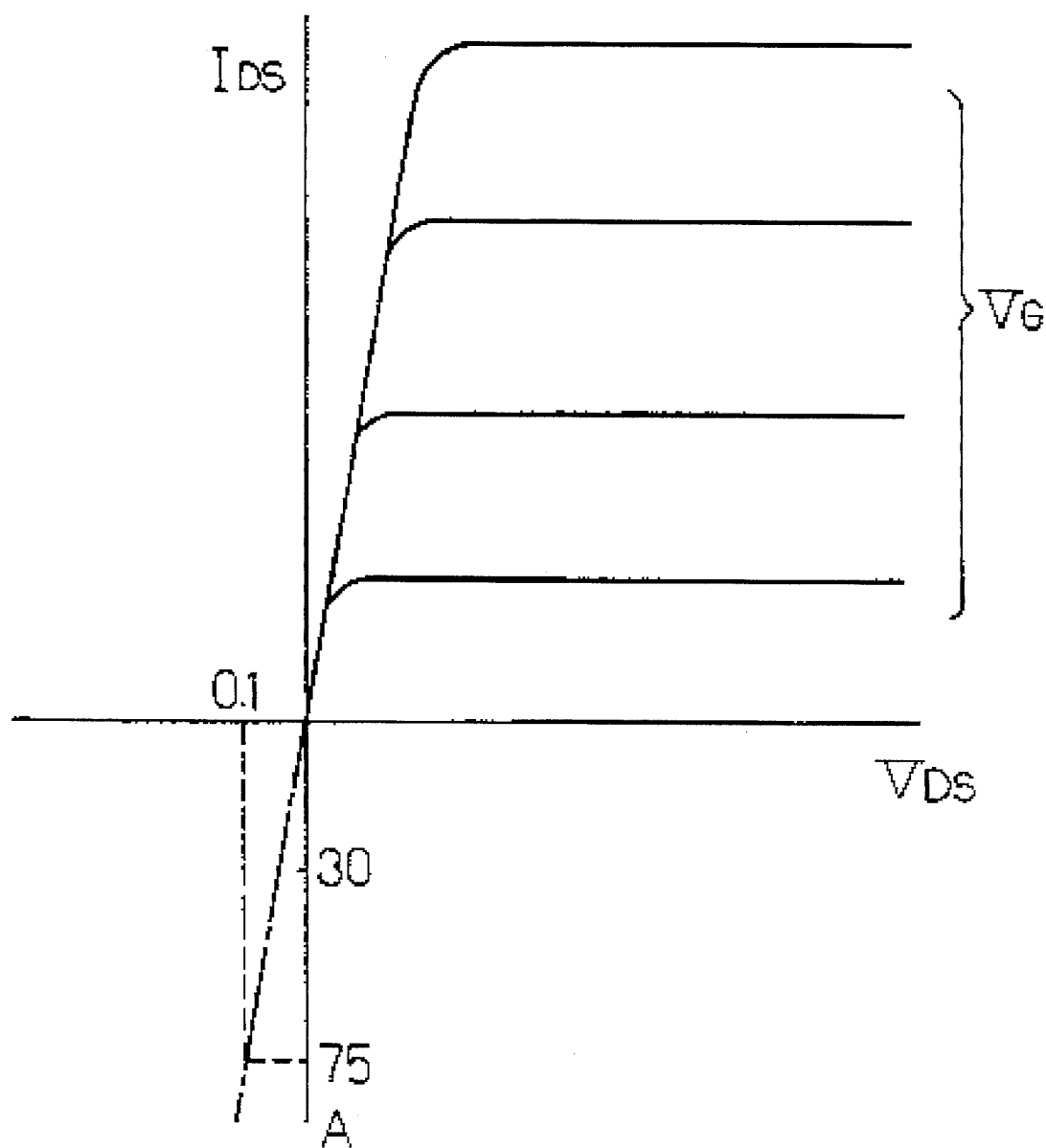
FIG. 9 is a graph showing the voltage-current characteristic of a power MOS transistor made of SiC according to the present invention.
Figure 10:
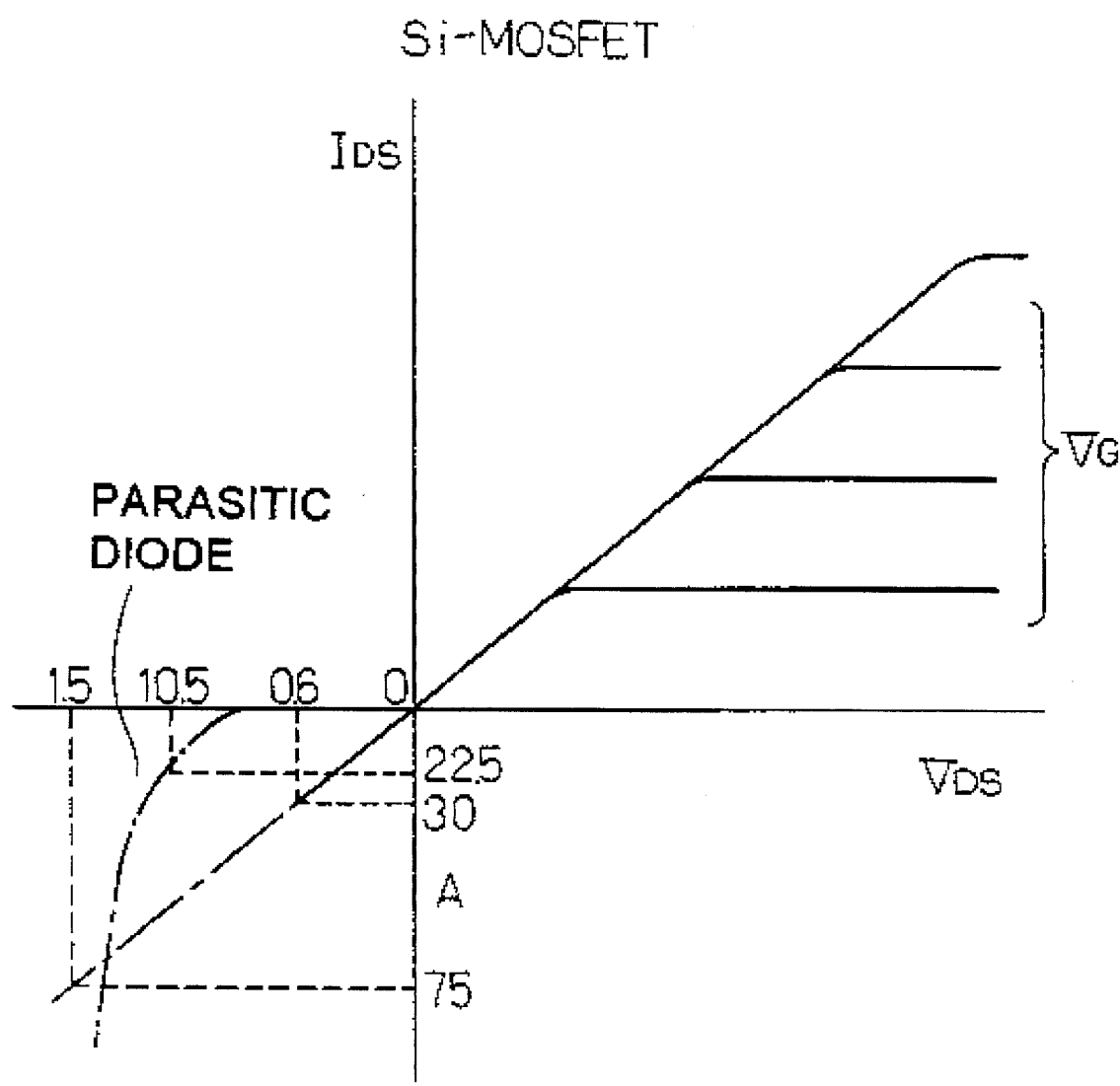
FIG. 10 is a graph showing the voltage-current characteristic of a power MOS transistor made of Si.

Power MOS transistors were fabricated out of Si and SiC, respectively, but with the same chip size and according to the same design rules. They had the same withstand voltage of 300 V. The current-voltage characteristics of these transistors are shown in FIGS. 9 and 10. FIG. 9 shows the characteristics of the power MOS transistor made of SiC. FIG. 10 shows the characteristics of the power MOS transistor made of Si. As can be seen from FIGS. 9 and 10, where the current flowing between the source and drain is 75 A, the three-phase full-wave rectification semiconductor circuit 19 of the present embodiment (using SiC-MOSFET) reduces power loss by more than 90% compared with the three-phase full-wave rectifier (using Si-MOSFET).

Figure 11:
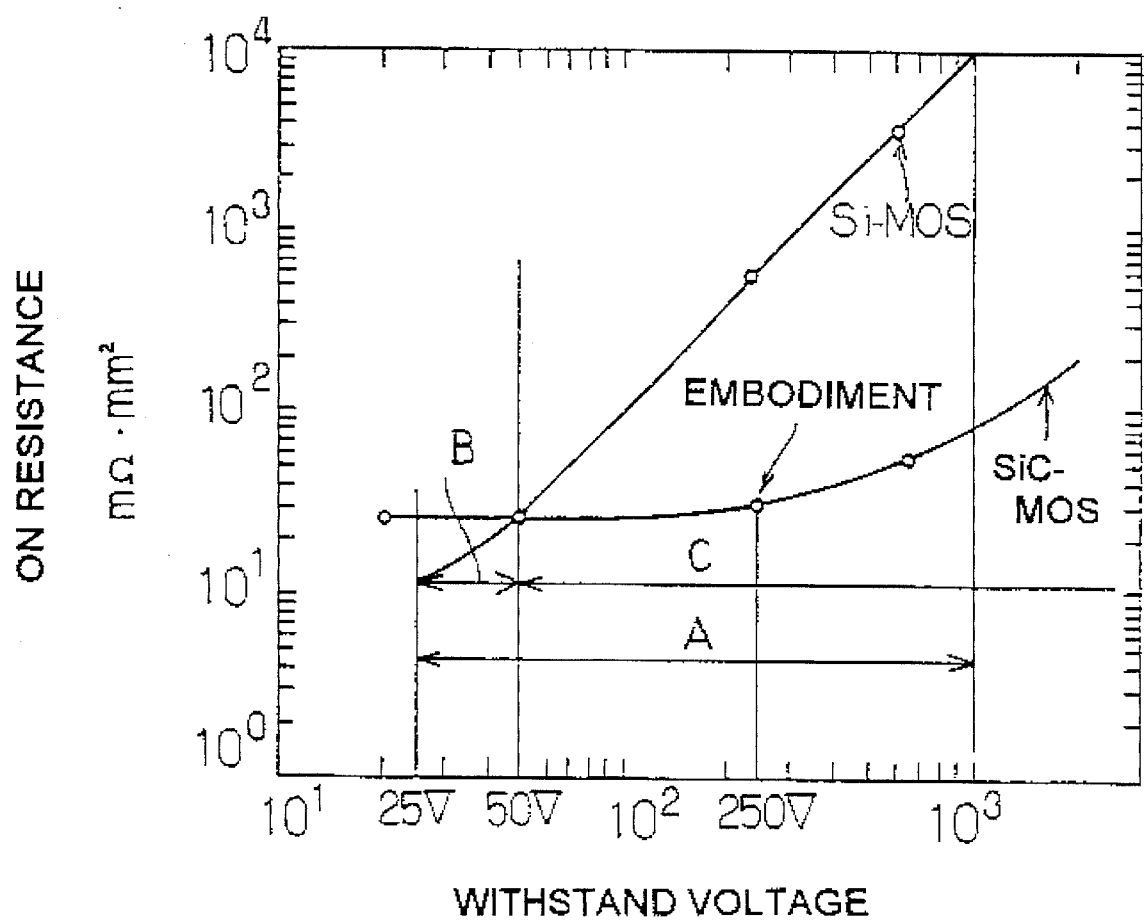
FIG. 11 is a diagram showing the relationship between the withstand voltage of the power MOS transistor shown in FIG. 9 and its channel resistance, as well as the relationship between the withstand voltage of the power MOS transistor shown in FIG. 10 and its channel resistance.

FIG. 11 shows an example of the results of calculations on the ON resistivity where the required withstand voltage of the power MOS transistor is varied. The ON resistivity is the sum of the channel resistance and the resistance of the N-type voltage-withstanding layer 105. Although the channel resistance is affected by various factors, the resistance of the N-type voltage-withstanding layer 105 prevails at high withstand voltages, as can be seen from FIG. 11.

More specifically, the channel resistance itself is hardly varied even if the required withstand voltage is increased provided that the increase in the channel resistance by the above-described feedback effect induced by an increase in the source parasitic resistance Rs is neglected. The resistance of the N-type voltage-withstanding layer 105 increases while the positive correlation between this resistance and the withstand voltage is maintained. Accordingly, as can be seen from FIG. 11, in the case of the power MOS transistor of Si, the ON resistivity increases proportionately as the required withstand voltage increases from close to a withstand voltage of 25 V. In the case of the transistor made of SiC, however, the increase in the resistance of the N-type voltage-withstanding layer 105 can be substantially neglected until the withstand voltage reaches 250 V, whereupon the ON resistivity begins to gradually increase.

In the above example, the power MOS transistors 19a–19f are each made of a single crystal of SiC assuming a hexagonal crystal system, and they are designed to have a withstand voltage of 300 V. The novel three-phase full-wave rectifier 19 for use in a vehicular AC generator used these power MOS transistors 19a–19f of SiC. Another three-phase full-wave rectifier 19 for use in a vehicular AC generator employed power MOS transistors of Si. The resistance values of these two types of commutators were analyzed, as illustrated in FIG. 11. The results are now theoretically described. It is assured that the effect of increase in the channel resistance due to the feedback effect of the source parasitic resistance Rs is neglected. The circuit assumes a vertical structure as shown in FIG. 8. They are equal in chip area.

The resistance R of one transistor is the sum of the channel resistance rc and the resistance rb of the $N^+$-type voltage-withstanding layer 105. The channel resistance is given by $$rc = L/W/(1/\mu s \cdot \epsilon s \cdot \epsilon o)^{-1} \cdot (Tox/(Vg-Vt))$$

The resistance of the N-type voltage-withstanding layer 105 is given by $$rb = 4 \ Vb^2 \cdot (1/\mu \cdot \epsilon s \cdot \epsilon o \cdot Ec \cdot A)$$

The resistance value of the power MOS transistor of SiC is about one fifteenth of the resistance value of the power MOS transistor of Si. The breakdown electric field intensity Ec of the Si transistor is $3 \times 10^5$ V/cm, while the breakdown electric field intensity of the SiC transistor is $3 \times 10^6$ V/cm. The dielectric constant $\epsilon s$ of the Si transistor is 11.8, whereas the dielectric constant of the SiC transistor is 10.0. They have the same area A of 1 $mm^2$. Indicated by Vb is their breakdown voltage or withstand voltage. In the above equations, $\mu$ is the electron bulk mobility. The electron bulk mobility of the power MOS transistor of Si is 1,100 $cm^2/(V \cdot s)$, while that of the power MOS transistor of SiC is 370 $cm^2/(V \cdot s)$. Their channel length L is 1 $\mu m$. Their channel width W is 222 $\mu m$. Indicated by $\mu s$ is the channel mobility. The channel mobility of the power MOS transistor of Si is 500 $cm^2/(V \cdot s)$, whereas that of the power MOS transistor of SiC is 100 $cm^2/(V \cdot s)$.

It can be seen from the above equations that the SiC device has a smaller resistance value at withstand voltages exceeding 50 V. The above calculations assume that the substrates are used as drains. Where the substrates are treated as the sources, the resistance of the Si device should increase greatly because of the aforementioned channel resistance increase by the feedback effect of the source parasitic resistance Rs.

In any case, we can estimate that the power MOS transistor of SiC has a low resistance with certainty at withstand voltages exceeding 100 V.

Specifically, as illustrated in FIG. 11, the current-handling device for use with a vehicular AC generator must withstand voltages lying in a range indicated by A. It can be expected that the MOS transistor made of Si can be used as a device withstanding less voltages (in a range B) within the tolerable range A. However, the MOS transistor made of SiC covers a wider range indicated by C.

In the present example, the power MOS transistors 19a–19c on the higher-voltage side can have a common source structure in which the voltage-withstanding layer is located on the side of the source. The power MOS transistors 19d–19f on the lower-voltage sides can have a common drain structure where the voltage-withstanding layer is located on the side of the drain. Therefore, as shown in FIG. 1, the power MOS transistors 19a–19c on the higher-voltage side is fabricated as one chip. As shown also in FIG. 1, the power MOS transistors 19d–19f on the lower-voltage sides is fabricated as one chip.

More specifically, as shown in FIGS. 1 and 8, the $N^+$-type substrate 106 forms a source S common to the power MOS transistors 19a–19c on the higher-voltage side. The P-type well regions 103 of the various phases on the substrate 106 are spaced from each other by a distance sufficient to prevent punch-through. A separate $N^+$-type drain region 104 is formed on the surface of each different P-type well region 103. Gate electrodes 110 are formed over the P-type well regions 103, respectively, via the gate-insulating film 109. Gate driving signals from the armature current-switching control circuit 10f are applied to their respective gate electrodes 110, whereby the drain regions 104 are separately electrically connected to the common source via the voltage-withstanding layers 105.

In this way, an integrated half-bridge consisting of the 3 MOS transistors 19a–19c on the higher-voltage side can be fabricated on one chip without adding any extra fabrication steps. Furthermore, the MOS transistors 19a–19c produce only low power loss and, therefore, the devices are prevented from getting hot in spite of the integrated structure.

Referring also to FIGS. 1 and 8, the $N^+$-type substrate 106 forms a drain D common to the power MOS transistors 19d–19f on the lower-voltage sides. The P-type well regions 103 of the various phases on the substrate 106 are spaced from each other by a distance sufficient to prevent punch-through. A separate $N^+$-type source region 104 is formed on the surface of each different P-type well regions 103. Gate electrodes 110 are formed over the P-type well regions 103, respectively, via the gate-insulating film 109. The gate driving signals from the armature current-switching control circuit 10f are applied to their respective gate electrodes 110, whereby the source regions 104 are separately electrically connected to the drain via the voltage-withstanding layers 105.

In this way, an integrated half-bridge consisting of the 3 MOS transistors 19d–19f can be fabricated on one chip without adding no extra manufacturing steps. Furthermore, the MOS transistors 19d–19f give rise to only small power loss and, therefore, the devices are prevented from getting hot in spite of the integrated structure.

Figure 12:
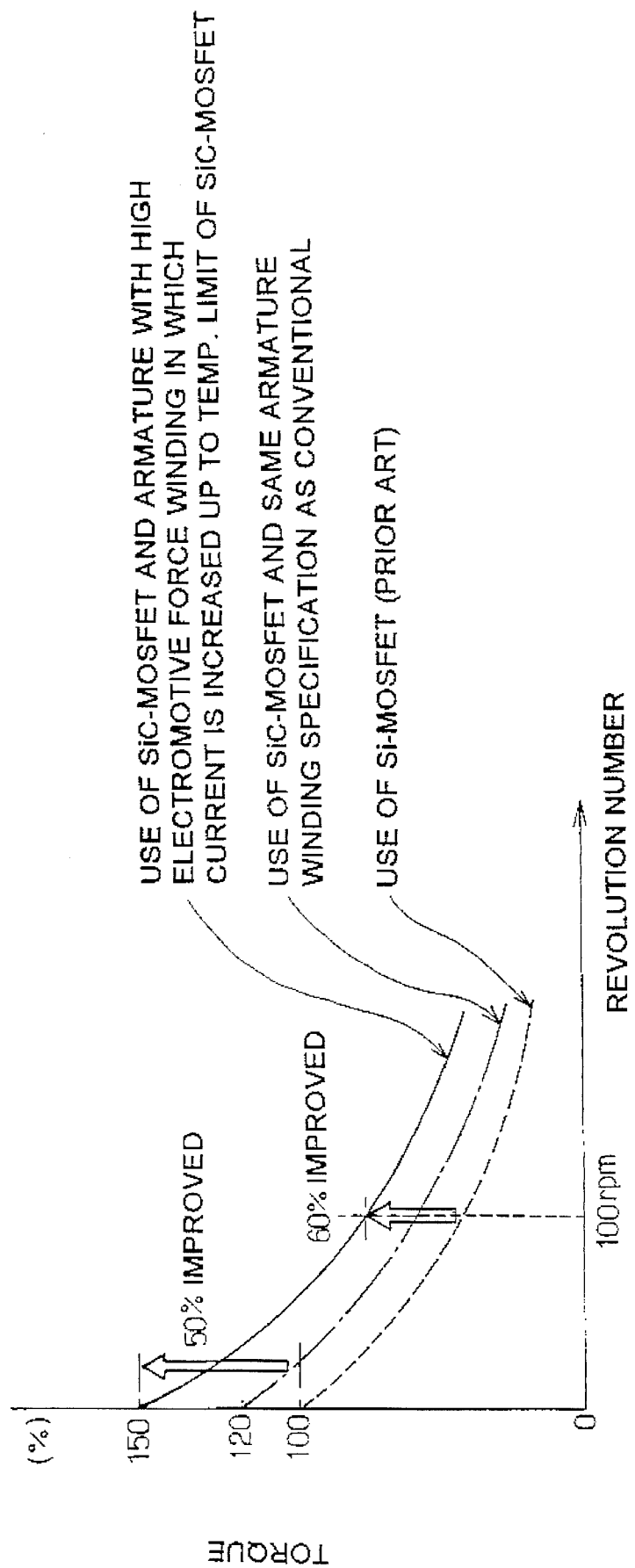
FIG. 12 is a diagram showing the relationships of torque to rotational speed where the power MOS transistors shown in FIGS. 9 and 10 are used.

As described above, the three-phase full-wave rectification semiconductor circuit 19 serves to generate electric power. Since the generator motor comprises magnet-type rotor, it is required for commutator to have high withstand voltage. Furthermore, it is required for commutator to exhibit low ON resistance for a large current flowing at the start-up, i.e., when no back electromotive force is produced. Since this rectification semiconductor circuit 19 comprises switching transistors of a single crystal of SiC, losses caused by the devices in the form of voltage drops are reduced greatly. In consequence, almost the whole battery voltage can be applied to the armature windings. As shown in FIG. 12, a 50% torque increase is accomplished at the start-up. A dramatic torque increase of about 60% is achieved when the machine is rotating steadily at 100 rpm. In this way, the main object of the invention has been attained. Furthermore, bidirectional rectification control devices are realized which prevent power supply short-circuit by means of the high-resistivity layers; otherwise the parasitic diodes would be biased into conduction in the forward direction. Hence, the field rotor can be fabricated essentially out of small-size, inexpensive permanent magnets.

FIG. 12 shows experimental values obtained when a generator motor operating in 12 V-120 A class was operated as a starter. The outside diameter of the armature core was about 130 mm. The pulley ratio was 2.9. The generator motor was operated on the side of the engine crank pulley to start up the engine. The increase rate of the torque produced at the rotational speed of 100 rpm is higher than the increase rate of the torque produced at the start-up, i.e., the rotational speed is 0 rpm, by 10 percent for the following reason. Since the ON resistance of the SiC transistor is low, the required terminal voltage can be developed even if the number of turns of the armature windings necessary as a generator motor is fewer by a value corresponding to the improvement of the ON resistance of the device. Therefore, the number of turns is reduced. This lowers the AC impedance, which in turns results in the higher torque increase rate described above. In this way, we have found that the use of SiC produces secondary effects.

As already described, the magnetic rotor has as many as 16 magnetic poles and is driven by the engine at a higher speed than the engine via a belt. Therefore, when the idling speed of the engine is about 500 rpm, the driving frequency is as high as 200 Hz. When the engine is running at a high speed, the driving frequency assumes a very high value of about 2 kHz. To suppress noise, it is common practice to set the carrier frequency of the above-described MOSFETs to a frequency about ten times as high as the driving frequency. Consequently, the switching frequency of the MOSFETs is very high, i.e., 2 to 20 kHz.

In this case, if the lead wires or conductors in the commutator circuit portion described above have inductance, it is difficult to increase the speed at which the conduction is controlled. In addition, it is known that a great amount of noisy electromagnetic radiation is radiated, thus presenting problems when the machine is used in practice. The present invention can solve the foregoing problems. That is, those portions which emit pulse signals or produce electric power variations are packaged into an integrated unit. This integrated unit is surrounded by a metal plate for protecting the unit against noises. The integrated unit is mounted midway between the metallic front and rear housings, together with the metal plate.

Figure 13:
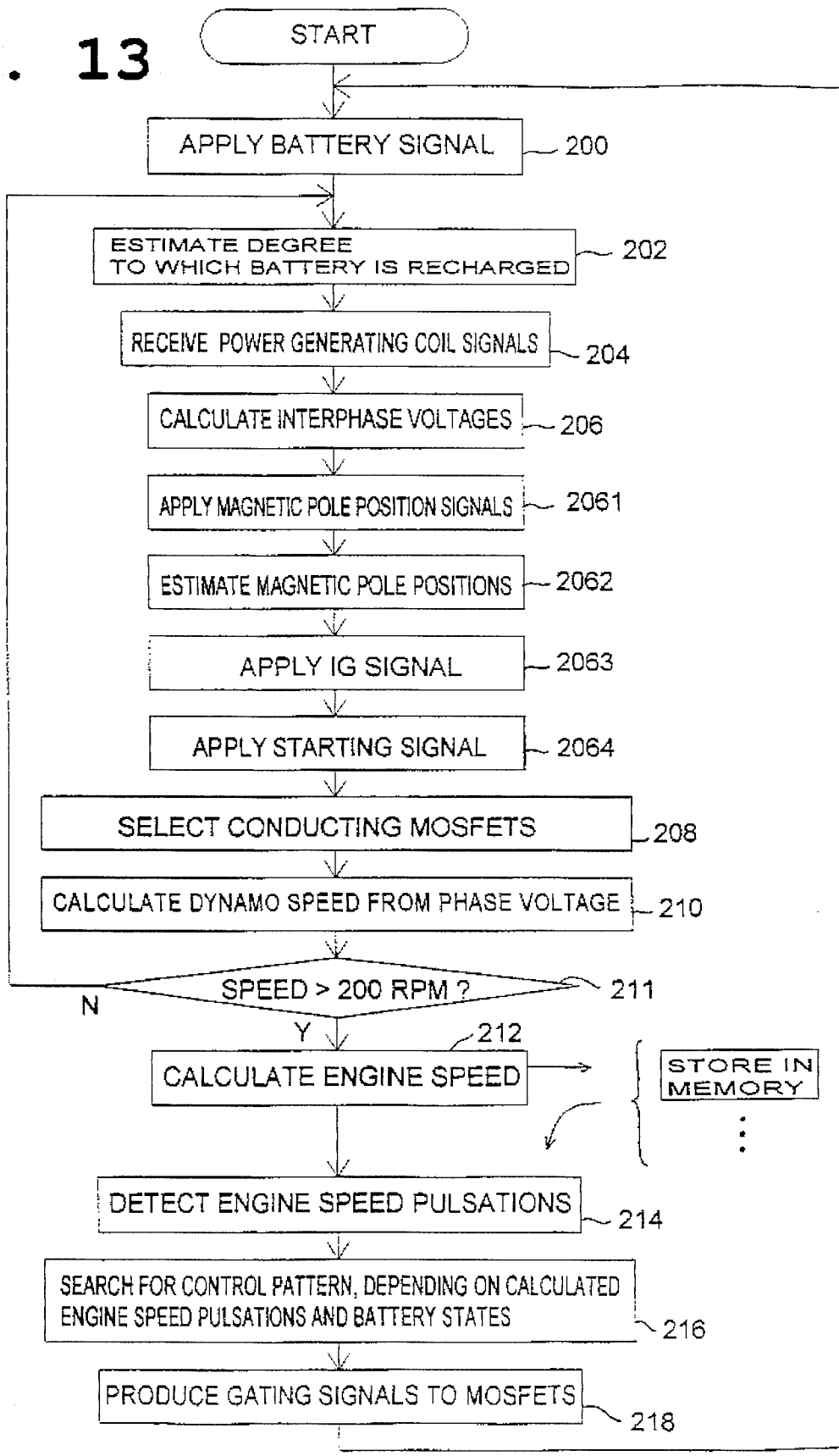
FIG. 13 is a flowchart showing an example of method of controlling the vehicular AC generator motor shown in FIGS. 2 and 3.

FIG. 13 illustrates a method of controlling the three-phase full-wave rectification semiconductor circuit 19 of the present embodiment. This control operation is carried out by a controller (not shown) whose functions are incorporated into a computer which controls a vehicular engine. Of course, the armature current-switching control circuit 10f can also perform these functions, which are described in detail below.

First, a signal indicating the battery voltage is applied (step 200). The degree to which the battery is recharged is estimated from the applied signal (step 202). Then, generator motor voltage signals Vu, Vv, and Vw from the output terminals of the three-phase armature windings 5 having various phases are received (step 204). Subsequently, the voltages between the adjacent lines of the various phases are calculated from the input voltage signals Vu, Vv, and Vw (step 206). Thereafter, the field magnetic pole positions are detected (step 2061). If detection of the angles fails as encountered when the engine is at rest, the angles are estimated by a predetermined logic (step 2062). An ignition (IG) signal is applied (step 2063). An engine starting signal is applied (step 2064). A decision is made as to whether the engine should be started or electric power is generated. When the engine should be started, the SiC MOSFETs are switched and selected so that the machine operates as a motor. When power generation should be effected, that phase which provides a line voltage exceeding the battery voltage and which is in the direction to recharge the battery is detected. The power MOSFETs on the higher and lower-voltage sides connected between the lines of this phase are selected (step 208).

Then, the rotational speed of the generator motor is calculated from the phase voltage (step 210). The engine speed is calculated from the calculated rotational speed of the generator motor and stored in a memory (step 212).

When the engine is idling, the engine is running unsteadily, resulting in torque variations. This in turn produces engine speed pulsations. Where the engine is a 4-cylinder engine, the second harmonic component of the engine speed pulsations is detected. Where the engine is a 6-cylinder engine, the third harmonic component of the engine speed pulsations is detected (step 214).

A predetermined control pattern is searched for, depending on the calculated engine speed pulsations and on the degree to which the battery is charged (step 216). Controlled amounts such as times for which the power MOS transistors 19a–19f are conducting and the timing at which the MOS transistors are driven on and off are determined. Then, the power MOSFETs 19a–19f are turned on and off according to the determined controlled amounts (step 218).

For example, when the remaining capacity of the battery is small, the power generation is carried out in such a way that emphasis is placed on the recharging. When the amount of the engine speed pulsation is large, the amount of generated electric power is varied so as to control the engine speed pulsations. In this way, the torque can be controlled.

Although control over the rotational speed pulsations was discussed theoretically in the past, the control has not been put into practice, for the following reasons. In the case of a field winding generator motor, mechanical vibrations are transmitted to the field coils, thus hindering or adversely affecting the rotation. Otherwise, the field circuit has a large time constant and so the machine is not adapted to suppress rotational speed pulsations at high speeds. In the case of a permanent-magnet rotor, a means for controlling the output current so as to suppress the resulting loss has not been discovered. In the present embodiment, the engine speed pulsations can be reduced while suppressing power loss.

Figure 14:
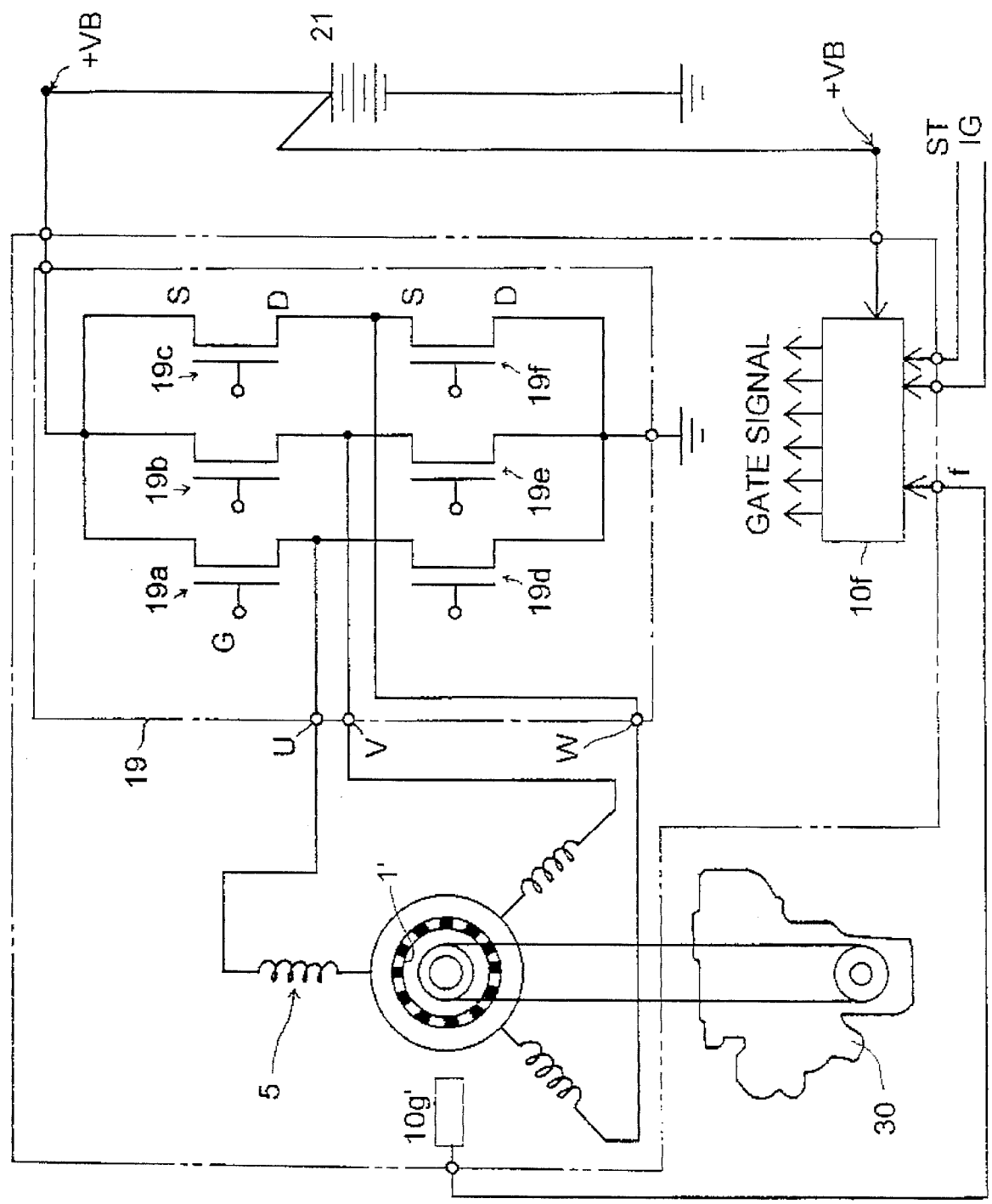
FIG. 14 is a circuit diagram of a second embodiment of the invention.

FIG. 14 is a circuit diagram of a second embodiment of the present invention. A three-phase induction generator motor is composed of a cage rotor 1' and three-phase armature windings 5. The integrated commutator shown in FIG. 14 is similar in structure to the first embodiment except that the armature current-switching control circuit 10f does not need the voltage signals from the armature windings.

The cage rotor 1' is rotated by the vehicular engine 30. At the same time, the armature current-switching control circuit 10f turns on and off the power MOS transistors 19a–19f, and applies three-phase AC voltages from the armature windings of the various phases. The amount of electric power generated and the mechanical energy produced by the generator motor are controlled by increasing and reducing the frequency of the three-phase AC voltages (i.e., slipping) with respect to a signal f from a rotational speed detector 10g' which indicates the rotational frequency of the rotor. In this induction machine, the amount of electrical current flowing into the armature is controlled by turning on and off the devices by pulse width modulation or other method. Therefore, surge voltages are produced. This needs a high withstand voltage in the same way as in the first embodiment.

In the present example, MOS transistors of SiC having a high withstand voltage and a low ON resistance are used in AC-DC converter means. Consequently, when a large current flows at start-up, the power loss caused by the devices as a voltage drop can be reduced greatly, in the same way as in the first embodiment. Hence, good driving torque can be obtained. In addition, in the induction machine of the present embodiment, the armature current component includes a field current component that generates magnetic flux. Therefore, the decrease in the voltage drop caused by the devices leads to an increase in the amount of magnetic flux in the air gap. This produces greater effect than the first embodiment where a separate magnetic flux-generating means is mounted in the rotor.

The rotor in this induction machine can be a winding type. Similar advantages can be obtained if the induction machine is other than a three-phase machine or a half-wave rectification inductor.

In the above embodiments, either the power MOS transistors 19a–19c on the higher-voltage side or the power MOS transistors 19d–19f on the lower-voltage side can be replaced by PN junction diodes. Furthermore, MOSFETs of SiC and MOSFETs of Si may be used together.

The present invention can also be applied to a field coil rotor in which the amount of the excited magnetic flux is not controlled. Additionally, the present invention can be applied to a rotor using field coils and magnets together.

In the description made thus far, the three-phase full-wave integrated commutator 10 for use with a starter/generator for a vehicle has been described. Since the three-phase full-wave rectification semiconductor circuit 19 of the above embodiments can be switched, it is obvious that it can be used as or in a switching inverter for generating three-phase AC voltages. In the above description, the generator motor is driven by a crank pulley. This pulley may be replaced by a gear or a planetary roller. In a further modified example, a pulley of a large diameter is used as the ring gear mounted on the side of the transmission and drives the generator motor directly or via a belt. In the above description, the full-wave rectification circuit portion, the rectification control portion, and the angular position detection portion are integrated into a unit. They may also be fabricated as separate components. Also in the above description, the generator uses permanent magnets. Obviously, similar advantages can be had by using a field winding generator. Furthermore, as storage battery of the above embodiments can be used both 12 V storage type and 24 V storage type.

Furthermore, in the above embodiments, the starter/generator acts as an auxiliary starter. This enables a reduction in the size of the main starter. The belt pulley ratio, or the speed increase ratio, is set to an appropriate value between about 2 and 5, and the whole starting torque can be produced by the auxiliary starter. In this case, the main starter can be dispensed with. Further, the function of producing a large locking torque at start-up may be assigned to the main starter, and then the function of producing torque at steady rotational speeds is allotted only to the starter/generator.

Also in the description made thus far, transfer of power to and from the engine is effected at a constant speed increase rate. If the power transfer is carried out via a speed change mechanism or a clutch, the required motor torque, i.e., electrical currents for energizing the devices, can be reduced. Of course, voltage loss induced by the device ON resistance decreases.

In the structures described thus far, it is not necessary to use power Zener diodes for absorbing large surges during power generation. Depending on the employed vehicle, large surges may be externally induced on the output lines, thus deteriorating the reliability. In this case, Zener diodes or capacitors for absorbing such extraneous surges of small energy may be added. This structure can be embodied within the scope of the invention.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A generator motor installed on a vehicle and performing generator operation and motor operation, said generator motor comprising:

a rotor having a rotating shaft and magnetic poles rotating with said rotating shaft which is driven by a crankshaft of an engine mounted on said vehicle, said rotating shaft being held to a housing;

an armature having a core firmly mounted to said housing and coils of plural phases, said coils being wound on said core;

an AC-DC converter means having plural MISFETs and connected between said coils of said armature and a storage battery, said AC-DC converter means acting to convert an AC output developed by said coils into a DC output used for charging said battery when said MISFETs are in a generator operation mode and to convert a DC output from said battery into an AC output for producing a rotating magnetic field when said MISFETs are in a motor operation mode, said rotating magnetic field producing a certain phase difference with said rotating magnetic poles, each of said MISFETs being made of silicon carbide (SIC) which is a chemical compound of silicon (Si) and carbon (C) and has a lower resistivity than silicon; and a switching means for switching mode of operation of said MISFETs between said generator operation mode and said motor operation mode.

2. The generator motor according to claim 1, wherein (A) said coils of said armature have three phases, (B) those of said MISFETs which are placed on a higher voltage side connect each end of said three-phase armature coils in parallel with a higher voltage terminal of said battery, and (C) those of said MISFETs which are placed on a lower voltage side connect each end of said three-phase armature coils in parallel with a lower voltage terminal of said battery.

3. The generator motor according to claim 1 or 2, wherein each of said MISFETs includes an N-type substrate forming a drain or source, an N-type voltage-withstanding layer formed on said substrate and doped more lightly than said substrate, a P-type well region formed on a surface of said voltage-withstanding layer, an N-type region formed on a surface of said well region and forming a source or drain, and a gate electrode placed relative to said well region such that this well region between said N-type region and said voltage-withstanding layer acts as a channel region.

4. The generator motor according to claim 2, wherein each of said MISFETs located on the higher voltage side includes an N-type substrate forming a common source, an N-type voltage-withstanding layer formed on said substrate and doped more lightly than said substrate, P-type well regions formed on a surface of said voltage-withstanding layer for the respective phases, N-type regions formed on surfaces of said respective well regions and forming a drain for each phase, and gate electrodes for the respective phases, relative to said well regions such that said well regions between their respective N-type regions and their respective voltage-withstanding layers act as channel regions for the phases, respectively.

5. The generator motor according to claim 2, wherein each of said MISFETs located on the lower voltage side comprises an N-type substrate forming a common drain, an N-type voltage-withstanding layer formed on said substrate and doped more lightly than said substrate, P-type well regions formed on a surface of said voltage-withstanding layer for the respective phases, N-type regions formed on surfaces of said respective well regions and forming a source for each phase, and gate electrodes for the respective phases, relative to said well regions such that said well regions between their respective N-type regions and their respective voltage-withstanding layers act as channel regions for the phases, respectively.

6. The generator motor according to claim 1 or 2, wherein said switching means controls gate voltages applied to said MISFETs in such a way that a voltage developed across said battery assumes a desired value in said generator operation mode, thus controlling said MISFETs by turning on and off them.

7. The generator motor according to claim 1 or 2, further comprising angular position detection means for detecting angular positions of said rotating magnetic poles of said rotor, and wherein, when said mode of operation is said motor operation mode, said switching means receives generated voltages of said phases from output terminals of said armature coils, receives angular position signals from said angular position detection means, and controls gate voltages applied to said MISFETs so that said MISFETs are turned on and off, whereby said rotating magnetic field created by armature current rotates with a predetermined angles with respect to said rotating magnetic poles.

8. The generator motor according to claim 1 or 2, wherein said battery is 12 V storage type or 24 V storage type.

9. The generator motor according to claim 1 or 2, wherein when said engine is started, said switching means places said MISFETs of said AC-DC converter means in said motor operation mode such that said generator motor produces an assisting starting torque and performs motor operation so as to work with a separate dedicated starter for said engine and produce a part of a total starting torque that the engine is required or so as to bear at least a part of a rotational speed range in which a starting torque is produced.

10. The generator motor according to claim 1 or 2, wherein said rotor includes a magnet-type rotor having permanent magnets or a cage rotor of induction machine.

\* \* \* \* \*